(12) United States Patent
Ozawa et al.

(10) Patent No.: US 10,437,368 B2
(45) Date of Patent: Oct. 8, 2019

(54) DISPLAY DEVICE AND PERSONAL DIGITAL ASSISTANT

(71) Applicant: Japan Display Inc., Minato-ku (JP)

(72) Inventors: Hideki Ozawa, Minato-ku (JP); Hajime Akimoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 65 days.

(21) Appl. No.: 15/878,461

(22) Filed: Jan. 24, 2018

(65) Prior Publication Data
US 2018/0232089 A1    Aug. 16, 2018

(30) Foreign Application Priority Data
Feb. 14, 2017    (JP) .................................. 2017-024642

(51) Int. Cl.
| | | |
|---|---|---|
| G06F 3/045 | (2006.01) | |
| G06F 3/041 | (2006.01) | |
| G06F 1/16 | (2006.01) | |
| G06F 3/044 | (2006.01) | |
| H01L 27/32 | (2006.01) | |
| H01L 51/00 | (2006.01) | |
| G02F 1/1333 | (2006.01) | |

(52) U.S. Cl.
CPC .......... *G06F 3/0412* (2013.01); *G06F 1/1626* (2013.01); *G06F 1/1643* (2013.01); *G06F 1/1652* (2013.01); *G06F 3/044* (2013.01); *G06F 3/0414* (2013.01); *H01L 27/3276* (2013.01); *G02F 1/13338* (2013.01); *G02F 1/133305* (2013.01); *G02F 1/133345* (2013.01); *G06F 2203/04105* (2013.01); *G06F 2203/04106* (2013.01); *H01L 27/323* (2013.01); *H01L 51/0097* (2013.01); *H01L 2251/5338* (2013.01)

(58) Field of Classification Search
CPC .......... G06F 1/16; G06F 3/041; G06F 3/0414; G06F 3/044; G06F 3/045; H01L 27/3276
See application file for complete search history.

(56) References Cited

U.S. PATENT DOCUMENTS

| | | | |
|---|---|---|---|
| 9,128,542 B2* | 9/2015 | King-Smith | ........ G06F 3/03545 |
| 2004/0095333 A1* | 5/2004 | Morag | ................ G06F 3/03545 345/173 |

(Continued)

FOREIGN PATENT DOCUMENTS

JP    2014-186711    10/2014

*Primary Examiner* — Joe H Cheng
(74) *Attorney, Agent, or Firm* — Oblon, McClelland, Maier & Neustadt, L.L.P.

(57) ABSTRACT

A display device includes a digitizer that outputs a signal according to an output value from a pressure sensor, a trigger generating circuit that receives the output from the pressure sensor and generates a trigger signal, a control circuit that drives the touch sensor and the pressure sensor, and a power supply circuit that supplies first electric power to the touch sensor, the pressure sensor, the digitizer, and the control circuit. When the power supply circuit does not supply the first electric power and there is input to the pressure sensor, the trigger generating circuit receives second electric power in response to the input. The trigger generating circuit generates and inputs the trigger signal based on the second electric power to the power supply circuit, and thereby, the power supply circuit shifts to a state of supplying the first electric power.

12 Claims, 15 Drawing Sheets

(56) References Cited

U.S. PATENT DOCUMENTS

| | | | |
|---|---|---|---|
| 2013/0207926 A1* | 8/2013 | Kremin | G06F 3/0383 |
| | | | 345/174 |
| 2014/0240298 A1* | 8/2014 | Stern | G06F 3/0383 |
| | | | 345/179 |
| 2015/0026638 A1* | 1/2015 | Kim | G06F 1/1626 |
| | | | 715/810 |
| 2015/0309599 A1* | 10/2015 | Michihata | G06F 3/03545 |
| | | | 345/174 |
| 2015/0355771 A1 | 12/2015 | Watazu et al. | |
| 2016/0139730 A1* | 5/2016 | Kida | G06F 3/0416 |
| | | | 345/174 |
| 2016/0162051 A1* | 6/2016 | Peretz | G06F 3/041 |
| | | | 345/179 |
| 2017/0262093 A1* | 9/2017 | Noguchi | G06F 3/044 |

* cited by examiner

DISPLAY DEVICE AND PERSONAL DIGITAL ASSISTANT

CROSS-REFERENCE TO RELATED APPLICATION

The present application claims priority from Japanese application JP2017-024642 filed on Feb. 14, 2017, the content of which is hereby incorporated by reference into this application.

BACKGROUND OF THE INVENTION

1. Field of the Invention

This invention relates to a display device, specifically to a display device with touch sensor. Particularly, the invention relates to a display device with touch sensor that can detect a pressing force on a touch detection surface, that is, can sense pressure.

2. Description of the Related Art

For personal digital assistants including smartphones, displays provided with touch sensors for detection of touch input to display surfaces by fingers, stylus pens, or the like are employed. Further, pressure sensors that detect not only with or without touches but also magnitude of pressure by touches are provided, and thereby, advanced control and advanced functions are provided.

Devices that recognize magnitude of pressure include devices that detect pressure-sensitive charge by piezoelectric materials (e.g. JP 2014-186711 A). Electric power generated by the piezoelectric material according to pressure is detected, amplified, and output by a charge amplifier. In this regard, the value of the electric power generated by the piezoelectric material varies depending on the magnitude of the pressure, and the magnitude of the pressure is recognized from the value of the electric power.

With requests for smaller and thinner personal digital assistants, and further, lower cost by reduction of the number of parts, etc., for example, switches mounted as mechanical switches in related art may be replaced by the above described pressure sensors. For example, when a power switch is replaced by the pressure sensor, with or without and magnitude of pressure should be electrically recognized unlike the mechanical switch. That is, even when the power of the personal digital assistant is off, the charge amplifier of the power switch should constantly wait for input. For this, the charge amplifier steadily consumes electric power.

SUMMARY OF THE INVENTION

An object of the invention is to provide a display device with touch sensor and a personal digital assistant that can achieve sufficient lower power consumption.

(1) A display device according to an aspect of the invention includes a display panel having a display area on a first surface of a substrate, a touch sensor provided on the first surface side of the display panel to be superimposed on the display panel, a pressure sensor provided on a second surface side opposite to the first surface of the display panel to be superimposed on the display panel, a digitizer adapted to receive output from the pressure sensor and output a signal according to a value of the output, a trigger generating circuit adapted to receive the output from the pressure sensor and generate a trigger signal, a control circuit adapted to drive the display panel, the touch sensor, and the pressure sensor, and a power supply circuit adapted to supply electric power to the display panel, the touch sensor, the pressure sensor, the digitizer, and the control circuit, wherein, when the power supply circuit does not supply the electric power and there is input to the pressure sensor, the trigger generating circuit receives electric power supplied from the pressure sensor in response to the input, the trigger generating circuit generates and inputs the trigger signal based on the electric power supplied from the pressure sensor to the power supply circuit, and the power supply circuit shifts to a state of supplying the electric power.

(2) A display device according to another aspect of the invention includes a display panel having a display area on a first surface of a substrate, a touch sensor provided on the first surface side of the display panel to be superimposed on the display panel, a first pressure sensor provided on a second surface side opposite to the first surface of the display panel to be superimposed on the display panel, a second pressure sensor provided in a location not superimposed on the first pressure sensor, a digitizer adapted to receive output from the first pressure sensor and output a signal according to an output value, a trigger generating circuit adapted to receive the output from the second pressure sensor and generate a trigger signal, a control circuit adapted to drive the display panel, the touch sensor, and the first pressure sensor, and a power supply circuit adapted to supply electric power to the display panel, the touch sensor, the second pressure sensor, the digitizer, and the control circuit, wherein, when the power supply circuit does not supply the electric power and there is input to the second pressure sensor, the trigger generating circuit receives electric power supplied from the second pressure sensor in response to the input, the trigger generating circuit generates and inputs the trigger signal based on the electric power supplied from the second pressure sensor to the power supply circuit, and the power supply circuit shifts to a state of supplying the electric power.

DETAILED DESCRIPTION OF THE INVENTION

Figure 1:
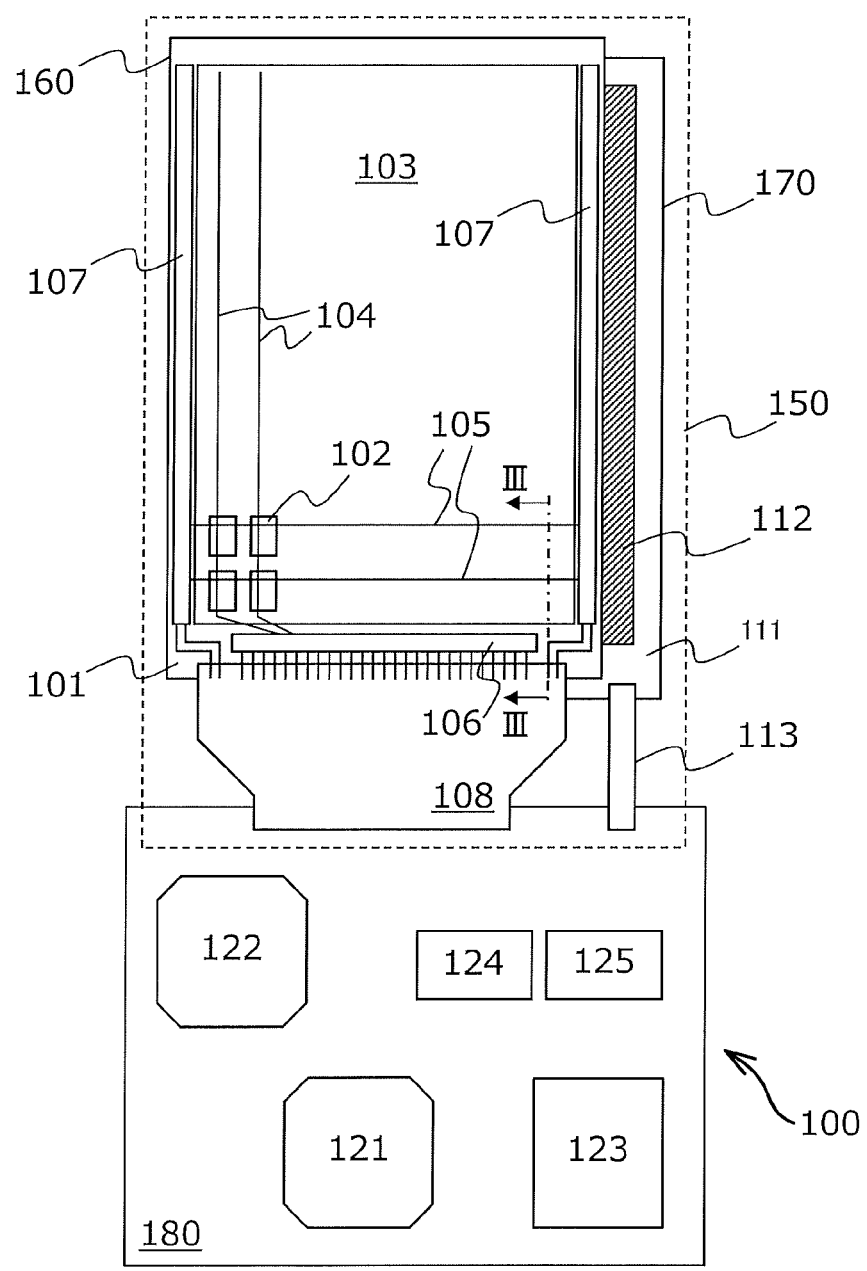
FIG. 1 is a plan view showing one embodiment of a personal digital assistant of the invention.

As below, embodiments of the invention will be explained with reference to the drawings. Note that the invention may be embodied in various forms without departing from the scope of the technical idea of the invention and should not be limited to the interpretation of the description of the embodiments to be exemplified.

In the drawings, for clearer explanation, widths, thicknesses, shapes, ratios, etc. of respective parts may be schematically shown compared to the actual forms, however, these are just examples and do not limit the interpretation of the invention to those shown in the drawings. In the specification and drawings, the same elements or the elements having the same functions described in relation to the previously mentioned drawings may have the same signs, and the overlapping explanation may be omitted.

Further, in the detailed description of the invention, when a position relationship between a certain configuration and another configuration is defined, "on" or "under" includes not only the case where the other configuration is located directly on or directly underneath the certain configuration but also the case where yet another configuration intervenes unless otherwise noted.

FIG. 1 shows a configuration a personal digital assistant according to an embodiment of the invention. A personal digital assistant 100 includes a display device with touch sensor 150 and a main board 180. The display device with touch sensor 150 shown in FIG. 1 includes a display panel 160 and a pressure sensor 170.

The display panel 160 is e.g. an organic electroluminescence (organic EL) display device and includes a display area 103 with pixel circuits 102 having display elements (here, organic EL elements) arranged in a matrix form on a substrate 101. In the display area 103, input of picture signals is controlled by a plurality of signal lines 104 and a plurality of scanning lines 105 and pictures are displayed. The picture signals are input from a data driver 106 to the signal lines 104. Selection signals are input from scan drivers 107 to the scanning lines 105. The data driver 106 and the scan drivers 107 receive the picture signals and control signals from a controller outside of the display panel 160 via a flexible printed circuit (FPC) 108 and operate. The scan drivers 107 are provided on both sides of the display area 103 in FIG. 1, however, the drivers may be provided only on one side. For example, the data driver 106 and the scan drivers 107 may be formed directly on the substrate 101 or an IC chip may be mounted on the substrate 101 or FPC 108.

The pressure sensor 170 includes a pressure-sensitive area 112 having a pair of electrodes and a piezoelectric layer provided between the electrodes on a substrate 111. The pressure sensor 170 is placed under the display panel 160, that is, superimposed on the opposite side to the display surface of the display panel 160. In FIG. 1, for the clear vertical relationship, the display panel 160 and the pressure sensor 170 are shown with offset, however, actually, these are provided so that the pressure-sensitive area 112 may be superimposed on the display area 103. Pressure is applied to the pressure-sensitive area 112, and thereby, electric power according to the pressure is generated in the piezoelectric layer. The electric power is output to outside of the pressure sensor 170 via the FPC 113.

The main board 180 has a CPU 121 for controlling the personal digital assistant, a display controller 122 for driving the display panel 160, a power supply circuit 123 for supplying electric power to the respective parts, a digitizer 124 that receives output from the pressure sensor 170, and a trigger generating circuit 125.

In addition, though not particularly shown in FIG. 1, other component elements for realization of the functions to be mounted as the personal digital assistant 100, e.g. a data transmitting and receiving unit, a non-contact IC tag, a sound input/output unit, etc. may be provided.

Figure 2:
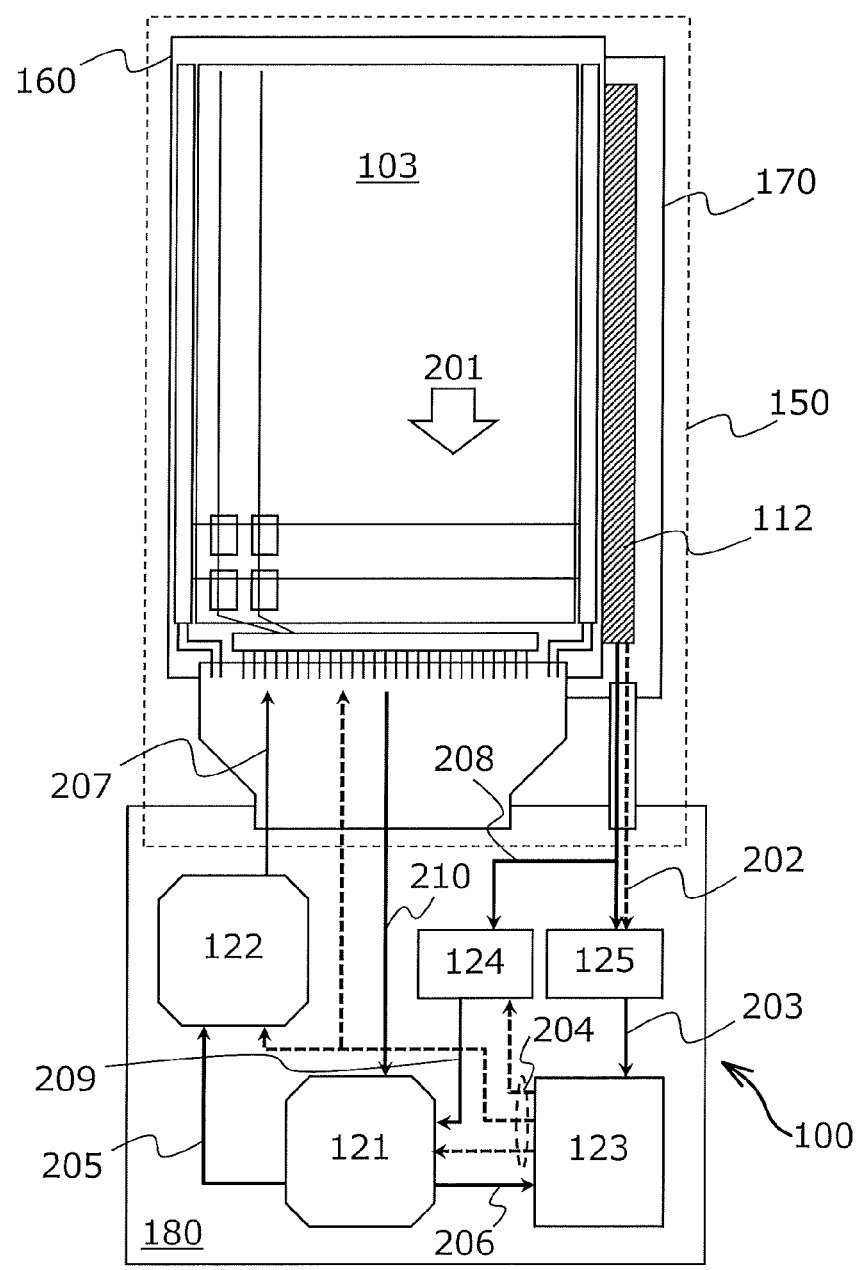
FIG. 2 is a plan view showing the one embodiment of the personal digital assistant of the invention and a sequence of operation.

The operation of the personal digital assistant 100 of the embodiment will be explained with reference to FIG. 2. In FIG. 2, the respective elements are connected by arrows, and the solid arrows indicate giving and receiving of signals and commands and dotted arrows indicate giving and receiving of electric power.

The personal digital assistant 100 may shift to a sleep mode for suppressing power consumption in a period in which data transmission and reception and terminal operation by a user are not performed. In the sleep mode, the display panel 160 stops image display and the CPU 121 stores the calculation result until immediately before in a memory (not shown) or the like built in itself and then stops calculation processing, the display controller 122 stops generation and output of the picture signals and control signals, and the digitizer 124 stops processing of signals from the pressure sensor 170. Therefore, power supply from the power supply circuit 123 to the respective parts also stops.

Under the condition, the user applies pressure from the display surface side of the display panel 160 (201). The pressure is transferred to the pressure-sensitive area 112 of the pressure sensor 170 via the substrate 101 and electric power is generated in the piezoelectric layer. At this point of time, the digitizer 124 stops and, even when receiving the electric power, does not detect the magnitude of the pressure.

On the other hand, the electric power generated by the pressure is input to the trigger generating circuit 125. In the trigger generating circuit 125, for example, when pulse is formed using the RC delay circuit or the like or the amplitude of the pulse by the electric power generated by pressure is too large, processing of producing a voltage drop and converting the amplitude to an appropriate amplitude as trigger pulse is performed. Thus obtained trigger pulse is input to the power supply circuit 123 (203). Other electric power is not supplied to the trigger generating circuit 125 and the sum of the electric power of the pulse output from the trigger generating circuit 125 does not exceed the sum of the electric power obtained from the piezoelectric layer, and thereby, when the pulse is used as a trigger for a plurality of apparatuses, signals maybe deteriorated due to the voltage drop and input to the respective apparatuses may be abnormal. Therefore, the first trigger pulse is input to the power supply circuit 123 and the power supply circuit 123 starts a recovery operation by the trigger pulse.

When the recovery operation of the power supply circuit 123 is completed, the electric power necessary in the respective parts is respectively output from the power supply circuit 123 (204). The power supply voltages rise in the respective parts, and thereby, the state shifts to a state in which the switches are ON. The CPU 121 reads back the stored data, restarts the normal calculation, and controls the display controller 122, the power supply circuit 123, etc. according to the normal operation mode (205, 206). Similarly, the display controller 122 restarts the generation of the picture signals and the control signals and restarts driving of the display panel 160 (207).

In this manner, the functions of the respective parts are recovered from the sleep mode, the digitizer 124 senses pressure on the pressure sensor 170, performs determination processing of the magnitude (208), and transmits the result to the CPU 121 (209).

Further, though not particularly shown in FIGS. 1 and 2, the display device with touch sensor 150 may have a touch sensor unit for detecting with or without touches on the display surface and coordinates thereof separately from the pressure sensor 170. In this regard, for the touch sensor unit, a capacitive-detection touch sensor of e.g. self-capacitance or mutual capacitance type may be used. Information on with or without touches and coordinates thereof obtained by the touch sensor unit is input to the CPU 121 (210), and subsequent response processing etc. is performed.

In the above described procedure, the recovery operation from the sleep mode based on the electric power generated in the pressure sensor is completed. Note that, here, the recovery operation from the sleep mode is explained, however, the same operation may be applied to the case where an apparatus is activated through normal power application procedure from the power-off state.

Figure 7A:
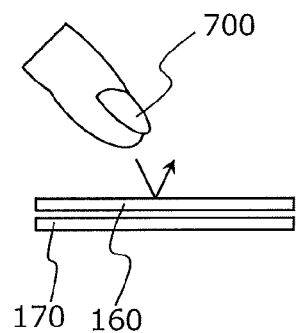
FIGS. 7A to 7J show touch actions by a user and output from a trigger generating circuit.
Figure 7B:
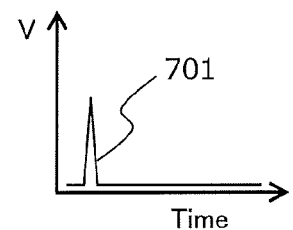
Figure 7C:
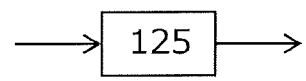
Figure 7D:
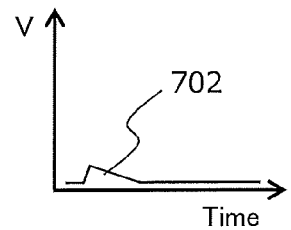
Figure 7E:
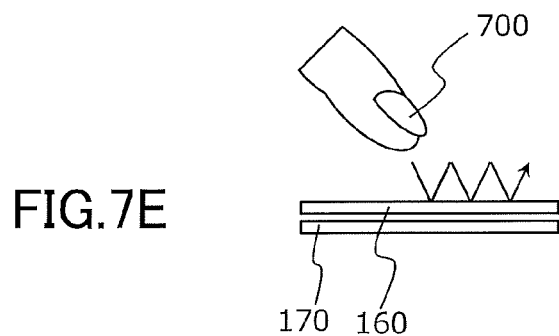
Figure 7F:
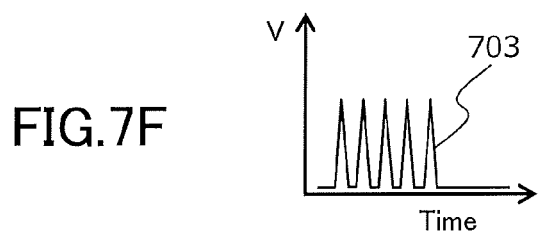
Figure 7G:
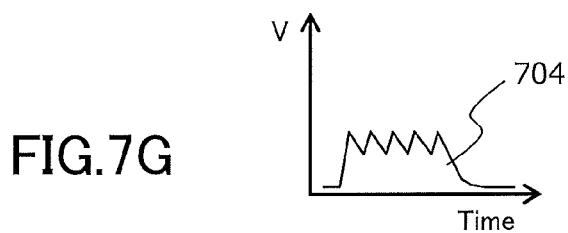
Figure 7H:
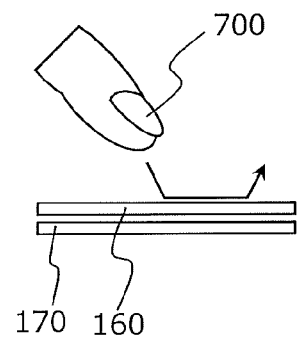
Figure 7I:
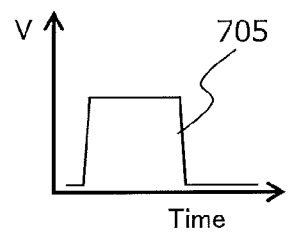
Figure 7J:
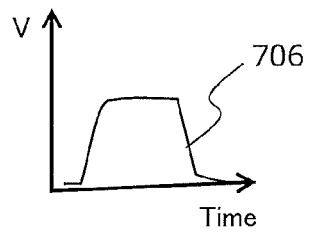

As shown in FIG. 7A, in the sleep mode, pressure not intended by the user may be applied to the pressure sensor 170, for example, in the case where the user suddenly touches the screen with a finger 700. In this case, to prevent unintended recovery from the sleep mode, as shown in FIG. 7B, even when electric power 701 with a very small pulse width like spike noise is output from the pressure sensor 170, the trigger generating circuit 125 may ignore the power (FIG. 7C). As shown in FIG. 7D, output 702 from the trigger generating circuit 125 is blunt and does not have a sufficient amplitude as trigger pulse, and is ignored. In this regard, for example, as shown in FIG. 7E, the user may perform an operation that can be clearly differentiated from the spike noise such as continuous multiple tap actions. The above described RC delay circuit does not output an effective signal even when receiving the spike noise. On the other hand, when continuously receiving electric power 703 at multiple times by the continuous tap actions as shown in FIG. 7F, the circuit may blunt and output those signals as a single signal 704 having a longer pulse width (FIG. 7G). Or, as shown in FIG. 7H, an operation of continuing to pressing the screen in a fixed time (e.g. one second) may be employed. In this case, the pressure sensor 170 continues output of electric power 705 according to the time in which pressure is applied as shown in FIG. 7I, and output 706 from the trigger generating circuit 125 functions as trigger pulse as it is (FIG. 7J).

Subsequently, an example of a detailed structure of the display device with touch sensor 150 will be explained using FIGS. 3 to 6.

Figure 3:
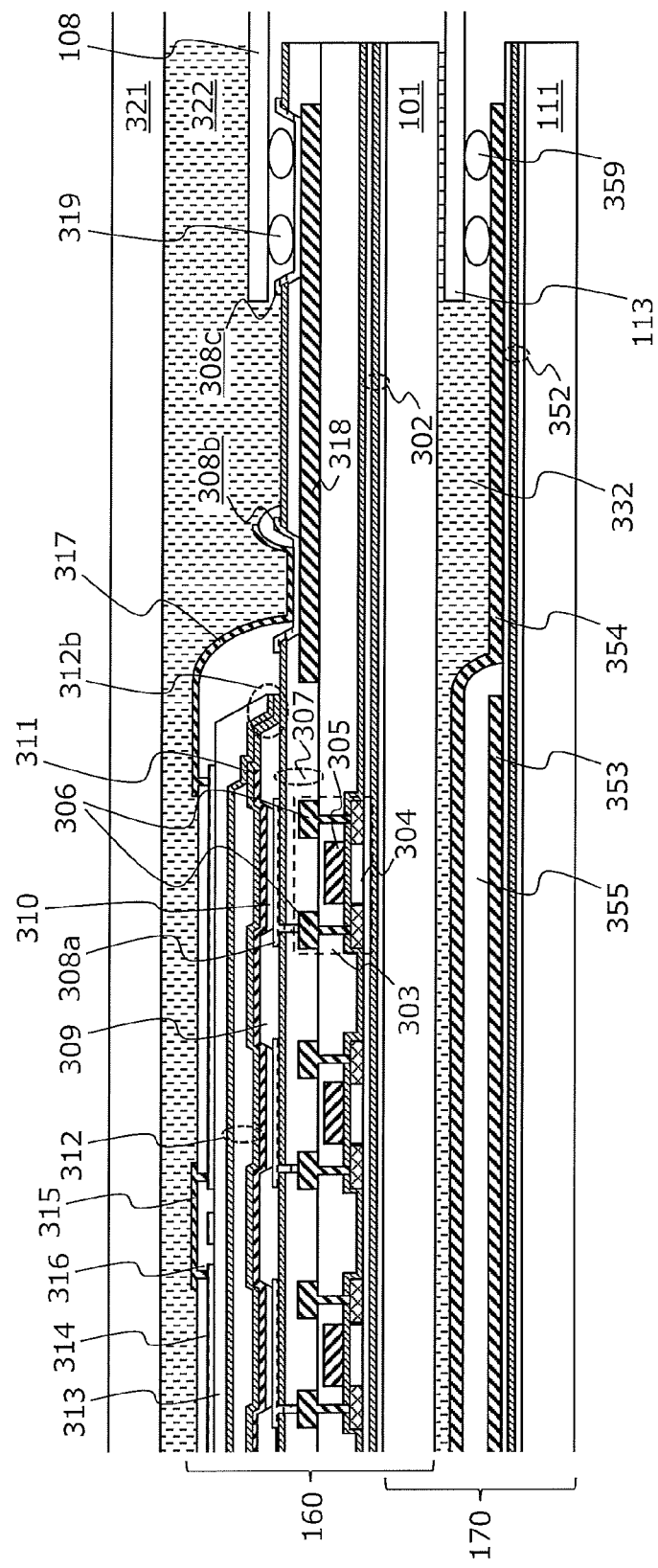
FIG. 3 is a sectional view showing one embodiment of a display panel of the invention.

FIG. 3 shows a section along III-III in the display device with touch sensor 150 shown in FIG. 1. The display panel 160 and the pressure sensor 170 are placed to be superimposed on each other and fixed to a cover glass 321 via an adhesive layer 322. In this regard, a picture displayed by the display panel 160 is visually recognized from the cover glass 321 side and the touch action by the user is performed via the cover glass 321. An adhesive layer 332 intervenes between the display panel 160 and the pressure sensor 170.

The configuration of the display panel 160 is explained. An undercoat layer 302 is provided on the substrate 101. As the substrate 101, glass, resin, or the like may be used and a substrate that may permit a certain level of deformation by pressure and transmit the pressure to the pressure sensor 170, that is, has flexibility is preferable. The undercoat layer 302 is shown as a three-layer structure of a silicon oxide film, a silicon nitride film, and a silicon oxide film. The silicon oxide film of the lowermost layer is provided for improvement of adhesion to the substrate 101 as one of the purposes, the silicon nitride film of the middle layer is provided for blocking moisture and impurities from outside as one of the purposes, and the silicon oxide film of the uppermost layer is provided for blocking hydrogen atoms contained in the silicon nitride film as one of the purposes, however, the layer is not limited to the structure. A single-layer or two-layer structure may be employed or a further stacking structure may be employed.

On the undercoat layer 302, thin-film transistors (TFT) 303 are formed. The TFT 303 has a semiconductor layer 304 in which a channel region, a source region, and a drain region are provided, a gate electrode 305, and a source-drain electrode 306. The gate electrode 305 and the source-drain electrode 306 are formed using conducting layers containing Mo, Ta, W, Al, Ti or an alloy or compound thereof.

After the formation of the TFTs, an interlayer insulating film 307 is formed. The interlayer insulating film 307 is formed for flattening of the concavities and convexities on the surface due to the formation of the TFTs as one of the purposes and an organic insulating material such as acryl is used. Further, like the above described undercoat layer 302, an inorganic material such as a silicon nitride film may be stacked for blocking moisture and impurities as one of the purposes.

Contact holes are opened in the interlayer insulating film 307 and pixel electrodes 308*a* are formed. The pixel electrodes 308*a* are individually formed with respect to each pixel and respectively connected to the TFTs via the contact holes. The pixel electrodes 308*a* are formed to include transparent conducting layers of ITO, IZO, or the like. In the case where contact holes in the connecting portions to a terminal wire 318 and contact holes in the terminal portions are formed at the same time with the above described opening of the contact holes in the interlayer insulating film 307, protective conducting layers 308*b*, 308*c* covering the opening portions of the contact holes may be formed at the same time with the pixel electrodes 308*a*.

After the formation of the pixel electrodes 308*a*, banks (ribs) 309 are formed to partition the respective pixels. The banks 309 are formed for covering the concavities and convexities of the end portions of the pixel electrodes 308*a* as one of the purposes and an organic insulating material such as acryl is used. The end portions of the respective pixel electrodes 308*a* are covered by the banks 309 and the opening portions are provided to expose the surfaces of the respective pixel electrodes 308*a*. It is preferable that the opening ends of the banks 309 have gentle tapered shapes. This is because, if the opening ends of the banks 309 have steep shapes, a coverage failure occurs in the layers to be formed later.

After the formation of the banks 309, organic materials forming an organic EL layer 310 are stacked. In FIG. 3, the organic EL layer 310 is shown as a single layer, however, a hole injection layer, a hole transport layer, a light emission layer, an electron transport layer, and an electron injection layer are staked sequentially from the pixel electrodes 308*a* side. These layers may be formed by evaporation or formed by application after solvent dispersion. Or, the layers may be selectively formed with respect to each pixel or solidly formed on the whole surface covering the display area 103.

In the case of solid formation, a configuration in which monochromatic lights are obtained in all pixels and lights having desired wavelengths are extracted using color filters and color conversion layers (not shown) may be employed.

After the formation of the organic EL layer 310, a counter electrode 311 is formed. Here, the top emission type using the cover glass 321 as a visually recognized surface is employed, and thus, the counter electrode 311 is formed as a transparent electrode. The electrode may be formed using a transparent conducting material such as ITO or IZO, or a metal layer containing Al, Mg, Ag or an alloy thereof may be formed in a thickness that may transmit light. The organic EL element is formed by the structure in which the organic EL layer 310 is sandwiched by the pixel electrode 308a and the counter electrode 311. According to the above described order of formation of the organic EL layer 310, the pixel electrode 308a serves as an anode and the counter electrode 311 serves as a cathode. Though not particularly shown in FIG. 3, the counter electrode 311 is formed from over the display area 103 to the contact region provided around the display area 103, connected to the under conducting layer in the contact region, and finally led out to the terminal portions.

After the formation of the counter electrode 311, a passivation layer 312 is formed. The layer is formed for protecting the previously formed organic EL element from entrance of moisture from outside as one of the purposes. As the passivation layer 312, a layer having a higher gas barrier property is required and, as a stacking structure including a silicon nitride film, the layer may be formed by a stacking structure of a silicon nitride film, an organic insulating film of acryl or the like, and a silicon nitride film or the like. Further, a silicon oxide film may intervene for improvement of adhesion between the silicon nitride film and the organic insulating film as one of the purposes. Note that, in the case where the stacking structure of the passivation layer 312 includes the organic insulating film, as shown by 312b, the organic insulating film may be formed not to be exposed in the end portions.

In the above described process, an organic EL display device as the display panel 160 is completed. Though not particularly shown in FIG. 1, a touch sensor may be further formed on the organic EL display device.

As below, a process of forming a touch sensor on the organic EL display device will be explained.

A protective layer 313 is formed on the passivation layer 312. For the protective layer 313, an organic insulating material such as acryl may be used. The protective layer 313 may also be used as a mask when the passivation layer 312 is removed from the terminal portion side to the end portion shown by 312b.

Touch electrode layers 314 are formed on the protective layer 313. The touch electrode layers 314 are arranged in a matrix form to be superimposed on the display area 103. Part of the layers are connected in the X-direction and the other layers are connected in the Y-direction crossing the X-direction. The crossing portions are formed by touch electrode layers 315 via touch insulating layers 316. Further, lead wires 317 for touch sensor are formed in the same layer as that of the touch electrode layers 314 or touch electrode layers 315. The touch electrode layers 314 and the touch electrode layers 315 are connected to the terminal wire 318 via the lead wires 317. To the terminal wire 318, the FPC 108 is connected via anisotropic conducting materials 319. The input of signals and electric power to the organic EL display device is also performed using lead wires (not shown) formed in the same layer as that of the lead wires 317.

Subsequently, the configuration of the pressure sensor 170 is explained. An undercoat layer 352 is provided on the substrate 111. For the substrate 111, glass, resin, or the like may be used. The undercoat layer 352 has the same configuration as that of the display panel 160, however, is not particularly limited.

A first electrode 353 is formed on the undercoat layer 352. As described above, when the display panel 160 includes the touch sensor, a solid electrode may be used as the first electrode 353 because it is unnecessary for the pressure sensor 170 to specify coordinates of pressed points.

A piezoelectric layer 355 is formed to cover the first electrode 353. The piezoelectric layer is classified roughly into a ceramic base and a polymer base depending on the material, lead zirconate titanate (PZT) is representative as the former and polyvinylidene fluoride (PVDF), polylactic acid (PLA), or the like is representative as the latter. In the embodiment of the invention, it is preferable that the piezoelectric layer 355 has a certain level of flexibility when formed as a layer, and thus, a polymer-based material is preferably used. In the case where the piezoelectric layer 355 may be formed in a thickness larger than that of the first electrode 353, the layer may be formed to cover the end portion of the first electrode 353. When the thickness of the piezoelectric layer 355 is smaller, the end portion of the first electrode 353 may be covered using another member, and then, the piezoelectric layer 355 may be formed.

A second electrode 354 is formed on the piezoelectric layer 355. The second electrode 354 is formed to be superimposed on the first electrode 353, and the first electrode 353 and the second electrode 354 and the piezoelectric layer 355 sandwiched between the electrodes form the pressure sensor. A solid electrode may be used for the second electrode 354 like the first electrode 353. Both the first electrode 353 and the second electrode 354 are led out to the terminal portions and connected to the FPC 113 via anisotropic conducting materials 359.

Figure 4:
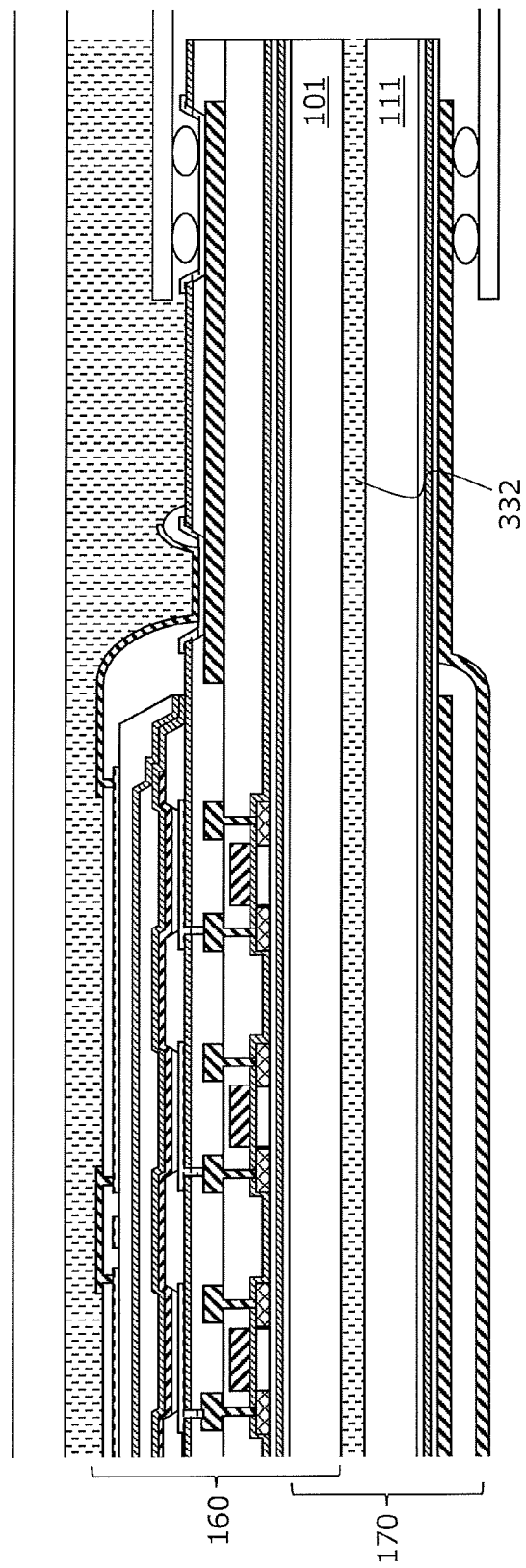
FIG. 4 is a sectional view showing the one embodiment of the display panel of the invention.
Figure 5:
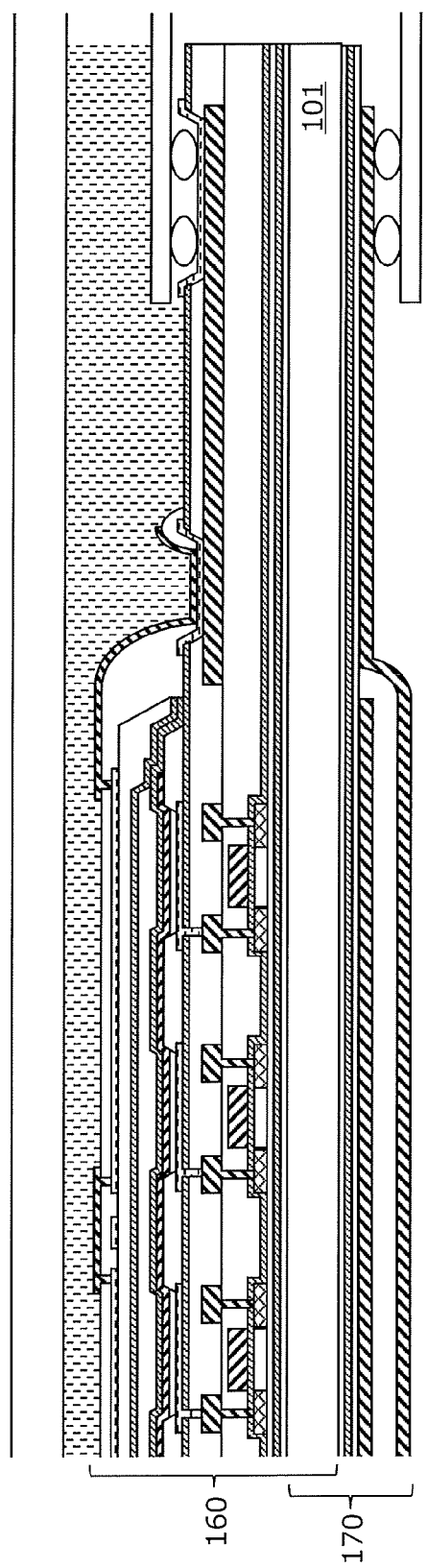
FIG. 5 is a sectional view showing the one embodiment of the display panel of the invention.
Figure 6:
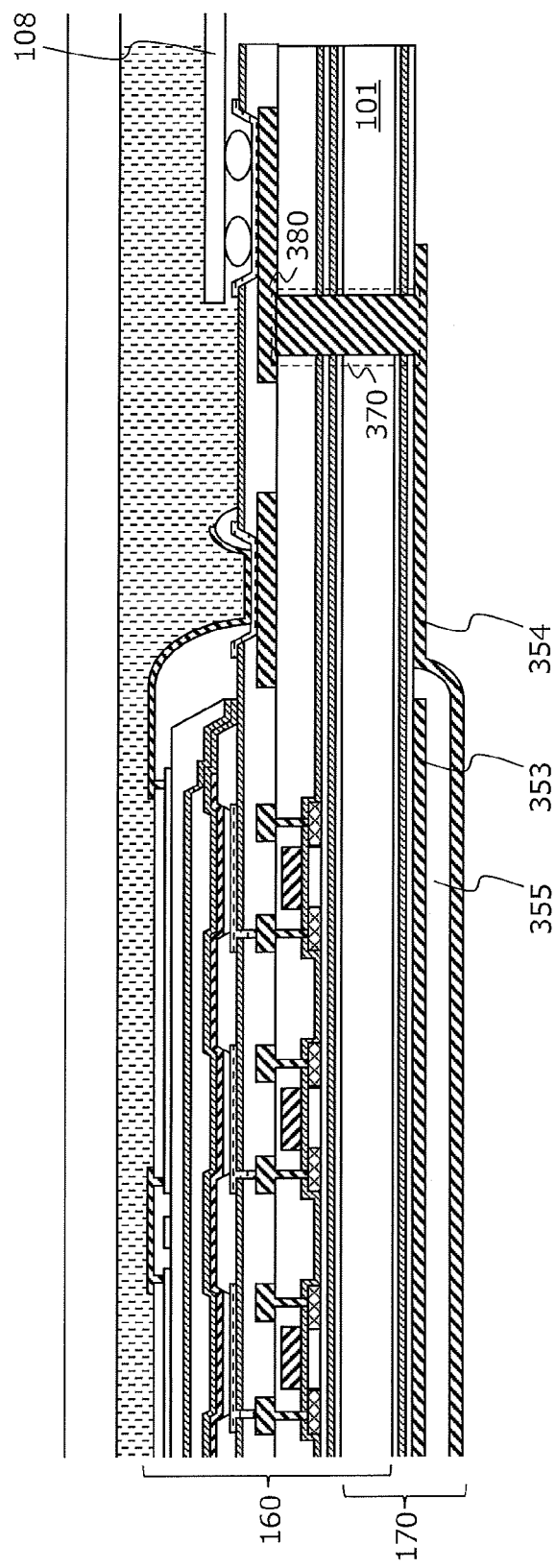
FIG. 6 is a sectional view showing the one embodiment of the display panel of the invention.

Regarding the configurations of the display panel 160 and the pressure sensor 170, in addition to the structure shown in FIG. 3, the back surfaces of the substrates may be bonded to face each other as shown in FIG. 4 or the display panel 160 and the pressure sensor 170 may be formed on the front and the back of the common substrate 101 as shown in FIG. 5. Further, when the display panel 160 and the pressure sensor 170 are formed on the front and the back of the common substrate 101, as shown in FIG. 6, a via 370 penetrating the substrate 101 may be provided and the first electrode 353 and the second electrode 354 may be connected to a terminal wire 380 on the display panel 160 side and connected to the FPC 108.

In FIGS. 1 and 2, regarding the pressure-sensitive area 112 of the pressure sensor 170, one pressure-sensitive area is formed to be superimposed on the entire display area 103, however, the shape is not limited to that, but includes e.g. another embodiment as below.

Figure 8:
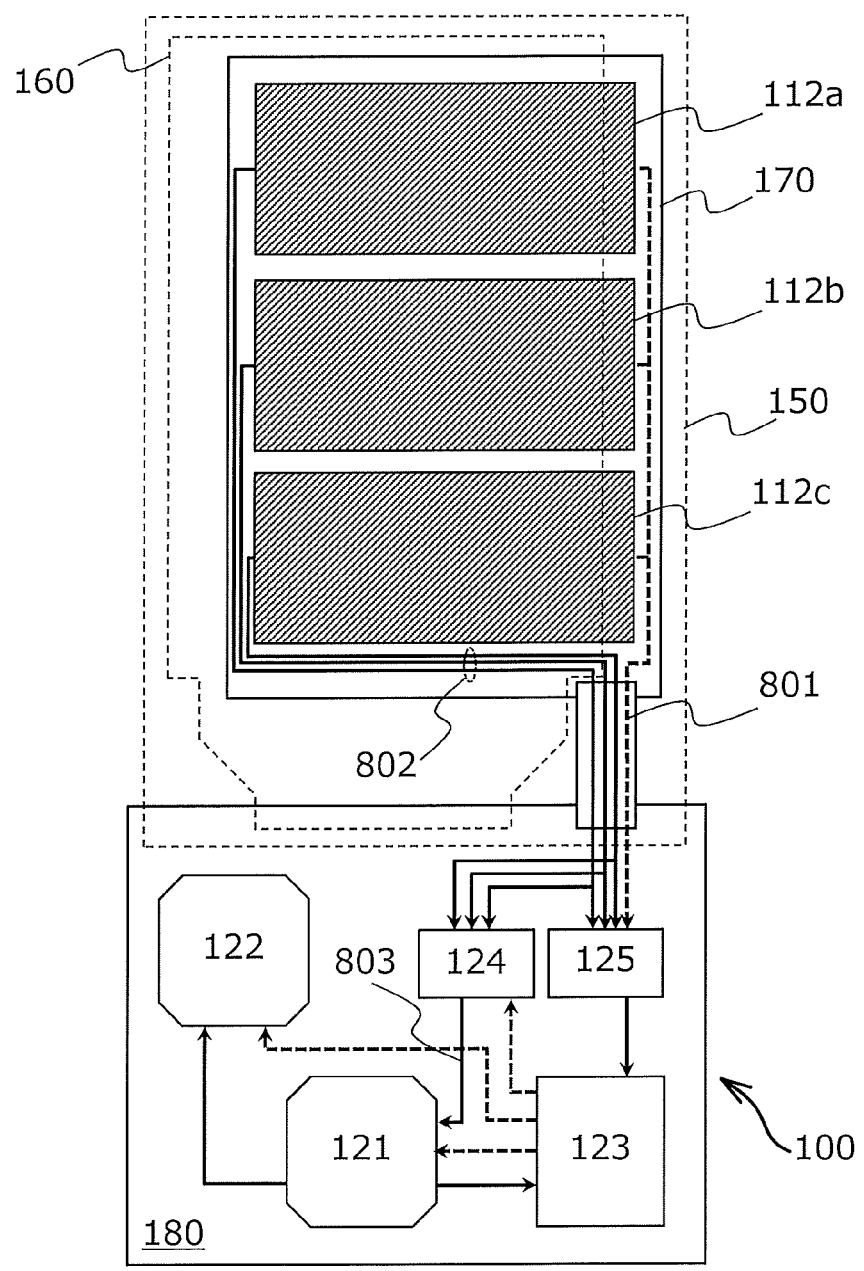
FIG. 8 is a plan view showing the one embodiment of the display panel of the invention.

FIG. 8 shows an example in which the pressure-sensitive area of the pressure sensor 170 is divided and provided into three areas 112a, 112b, 112c. For clear illustration, the display panel 160 and the display area 103 thereof are omitted in FIG. 8.

In the case where the recovery from the sleep mode is made based on the input to the pressure sensor 170, when there is input to arbitrary one of the pressure-sensitive areas 112a, 112b, 112c, the generated electric power may be input to the trigger generating circuit 125 (801), and it is unnecessary for the trigger generating circuit 125 to recognize the area to which there has been the input. On the other hand, in the normal operation mode, input to the pressure-sensitive areas 112a, 112b, 112c is individually input to the digitizer 124 (802), and the circuit recognizes the area to which there has been the input and reflects the recognition on the subsequent apparatus operation (803).

Obviously, the number of division of the pressure-sensitive area is not limited to three as shown in FIG. 8, but may be two, four, or more. Further, the recovery from the sleep mode may be executed only when there is input to one of the divided pressure-sensitive areas. In this regard, input to the other pressure-sensitive areas may not be received or used as triggers for shifting from the sleep mode to another state.

Figure 9:
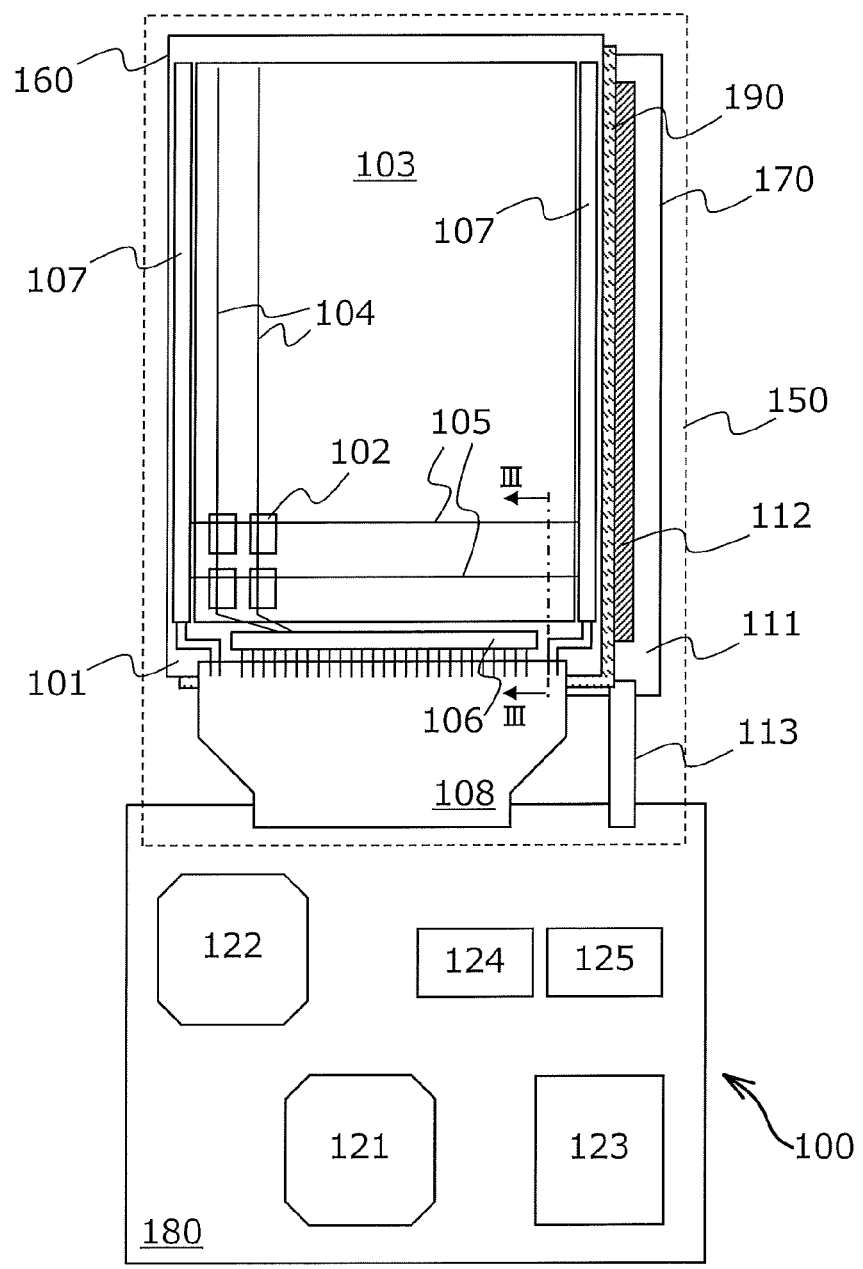
FIG. 9 is a plan view showing the one embodiment of the display panel of the invention.

FIG. 9 shows an example in which a liquid crystal display device (LCD) is used as the display panel 160 in place of the above described organic EL display device and combined with the pressure sensor 170. In this case, the liquid crystal display device is not a self-emitting device, and an optical unit 190 is further provided between the display panel 160 and the pressure sensor 170. The optical unit 190 includes a backlight unit, a prism sheet, a diffusion sheet, etc. In this case, it is necessary to transmit pressure from the surface of the display panel 160 to the pressure sensor 170 via the optical unit 190, and it is preferable that the optical unit has a certain level of flexibility.

Though not particularly shown, in the case where the liquid crystal display device is used as the display panel 160, in addition to the substrate on which the TFTs are formed, an opposite substrate opposed thereto at a fixed gap and a liquid crystal material sandwiched by the substrate and the opposite substrate is included. Therefore, the above described touch sensor may be provided by e.g. formation of electrodes on the surface of the opposite substrate.

Figure 10:
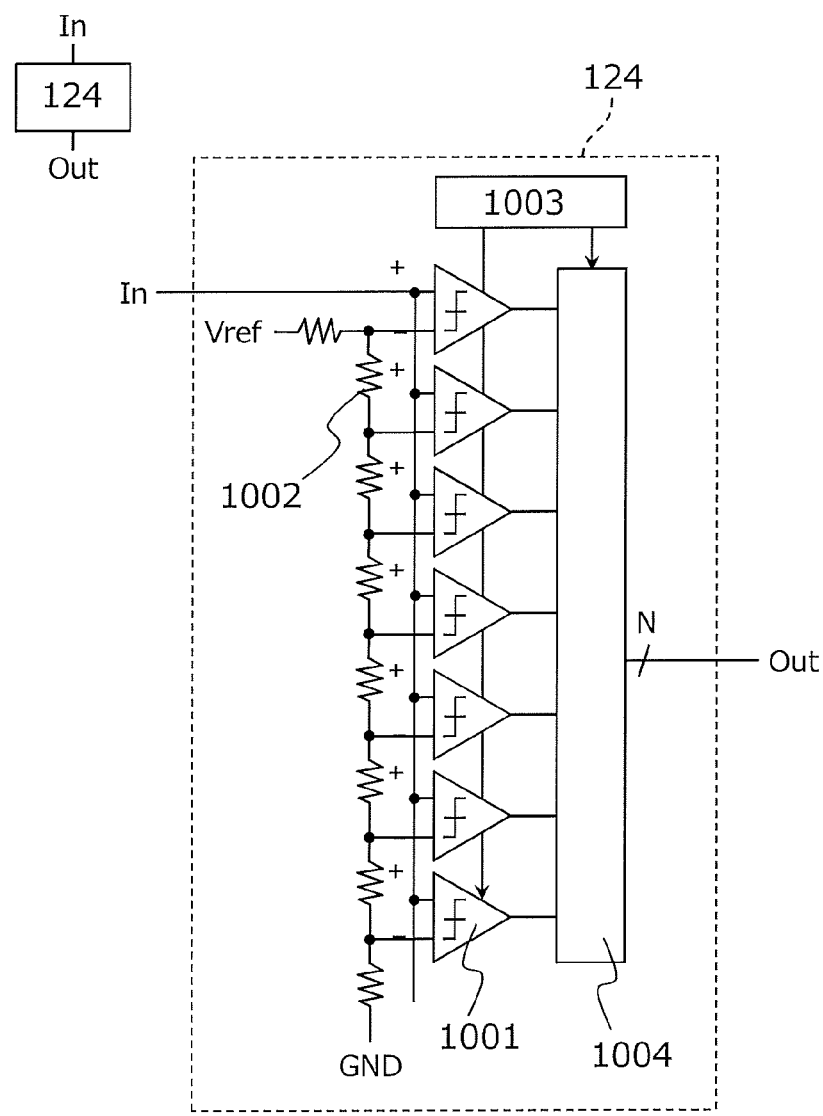
FIG. 10 shows an example of a digitizer.
Figure 11:
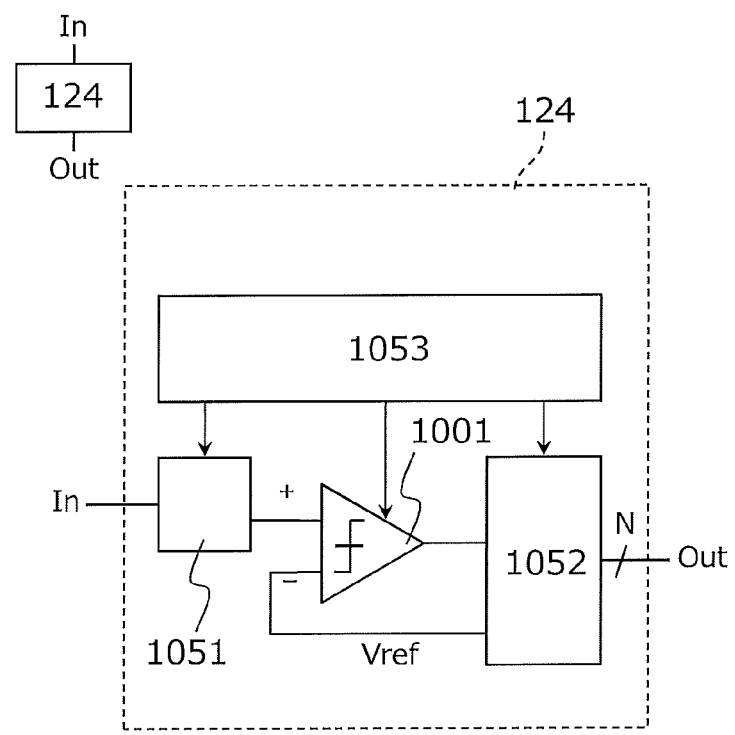
FIG. 11 shows another example of the digitizer.
Figure 12:
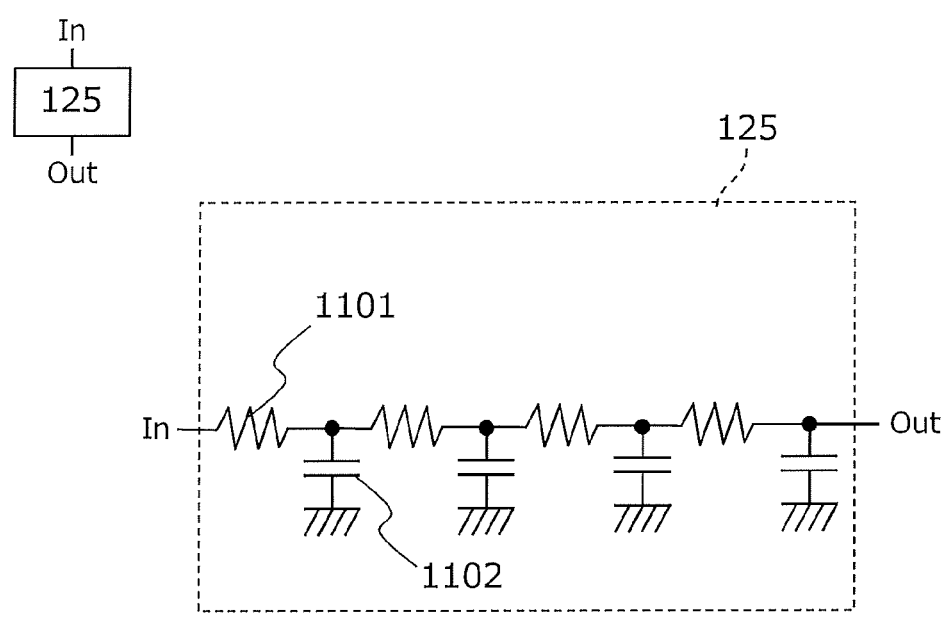
FIG. 12 shows an example of a trigger generating circuit using an RC delay circuit.

Configuration examples of the digitizer 124 are shown in FIGS. 10 and 11 and a configuration example of the trigger generating circuit 125 is shown in FIG. 12.

FIG. 10 is an example of a parallel-input digitizer in which a plurality of comparators 1001 are provided in parallel and input signals are distributed to input terminals of the respective comparators. To the respective comparators 1001, reference potentials formed by appropriate division of a voltage between Vref-GND by resistances 1002 are input. Magnitude comparisons of the input are performed with respect to the reference potentials in the respective stages based on strobe signals output from a timing controller 1003, and the finally obtained output is received by a comparator 1004 and output as digital data. In the parallel-input configuration, to obtain N-bit digital output, 2n-1 stages of comparators are necessary. That is, in the example of FIG. 10, 3-bit digital output is obtained by the seven stages of comparators.

FIG. 11 is an example of a serial-input digitizer in which only one stage of comparator 1001 is provided. On the other hand, the input signal is once held in a sample hold circuit 1051, and then, input to the comparator 1001. In this example, regarding the reference potential, the value of Vref is sequentially changed by a main processor 1052, and thereby, magnitude comparisons of input with respect to the respective reference potentials are performed in chronological order. The output of the comparator 1001 according to the respective reference potentials is input to the main processor 1052, and N-bit digital output is output as a result of input of all output. The operation timing of the sample hold circuit 1051, the introduction timing to the comparator 1001, the output timing of the reference potential from the main processor 1052, etc. are collectively controlled by a timing controller 1053.

FIG. 12 shows an example of the trigger generating circuit 125 and includes an RC delay circuit having a resistance 1101 and a capacitor 1102. The input/output relationships are as has been explained using FIGS. 7A to 7J.

Figure 13:
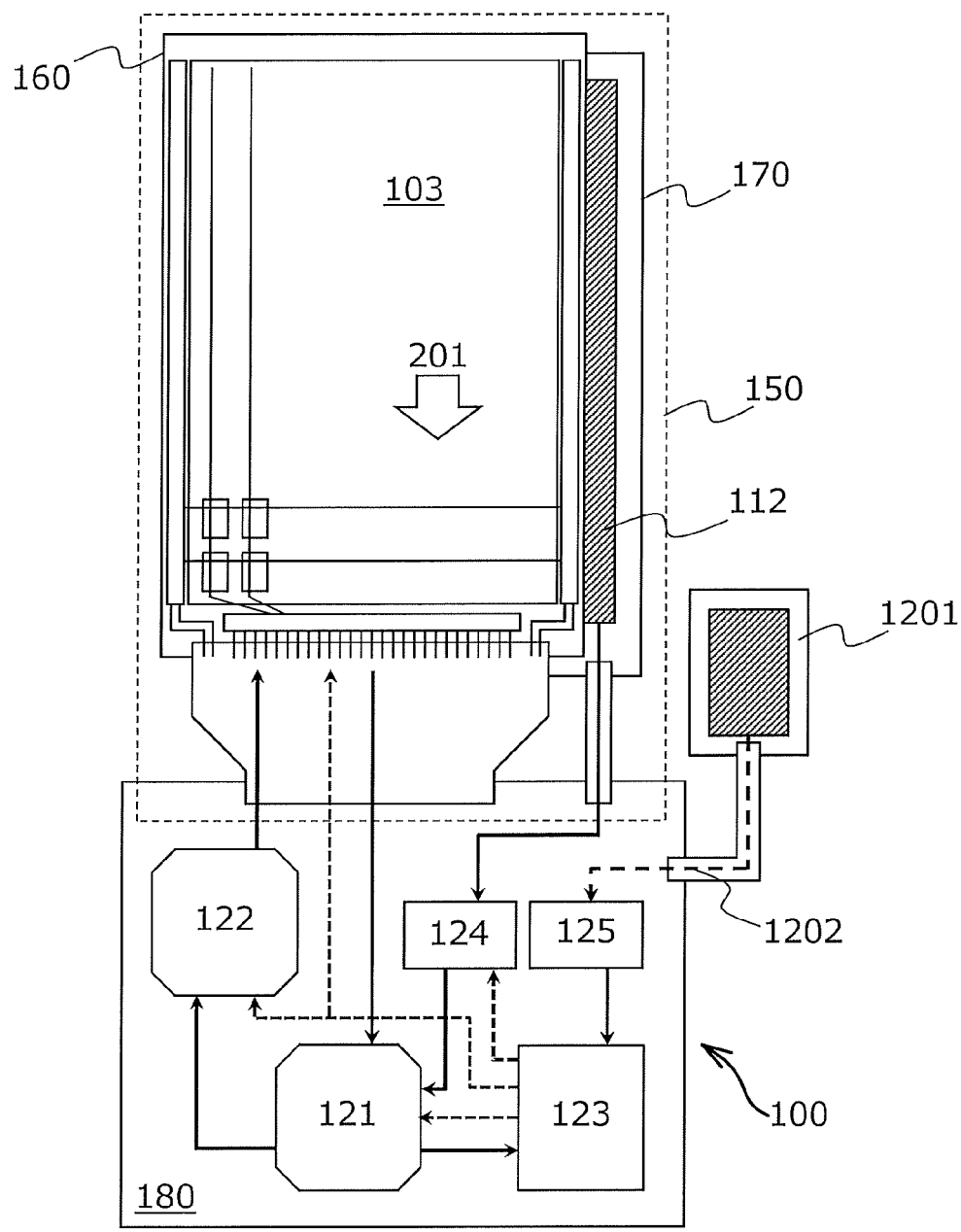
FIG. 13 is a plan view showing the one embodiment of the display panel of the invention.

In the above described embodiment, the recovery from the sleep state using the input to the pressure-sensitive area 112 superimposed on the display area 103 as a trigger is shown, however, as shown in FIG. 13, a pressure sensor 1201 may be separately provided in the personal digital assistant. The output from the pressure sensor 170 is input to only the digitizer 124. On the other hand, when pressure is applied to the pressure sensor 1201, thereby generated electric power is input to the trigger generating circuit 125. The pressure sensor 1201 may be provided in any location of the casing of the personal digital assistant and, for example, to prevent false operation, maybe provided in a recessed location.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a display panel having a display area on a first surface of a substrate;
    a touch sensor next to the first surface of the display panel, the touch sensor overlapping with the display panel;
    a pressure sensor next to a second surface opposite to the first surface of the display panel, the pressure sensor overlapping with the display panel;
    a digitizer for receiving an output from the pressure sensor and outputting a signal according to a value of the output;
    a trigger generating circuit for receiving the output from the pressure sensor and generating a trigger signal;
    a control circuit for driving the display panel, the touch sensor, and the pressure sensor; and
    a power supply circuit for supplying first electric power to the display panel, the touch sensor, the pressure sensor, the digitizer, and the control circuit,
    wherein the trigger generating circuit is configured to receive second electric power supplied from the pressure sensor in response to an input to the pressure sensor while the power supply circuit does not supply the first electric power, generate the trigger signal based on the second electric power supplied from the pressure sensor, and input the trigger signal to the power supply circuit to make the power supply circuit capable of supplying the first electric power.

2. The display device according to claim 1, wherein the trigger generating circuit is adapted to receive the second electric power only through the output from the pressure sensor.

3. The display device according to claim 1, wherein the display panel is an organic EL display panel having an organic EL element in the display area, the organic EL element comprising
    some pixel electrodes on the substrate,
    an organic layer containing a light emission layer on the pixel electrodes, and
    a counter electrode on the organic layer, wherein the touch sensor includes a plurality of touch electrodes on a surface of an insulating layer on the organic EL element.

4. The display device according to claim 1, wherein the display panel is a liquid crystal display panel having a liquid crystal element in the display area, the display device further comprising an optical unit between the liquid crystal display panel and the pressure sensor.

5. The display device according to claim 1, wherein the substrate has flexibility.

6. A personal digital assistant comprising a casing, the casing containing the display device according to claim 1.

7. A display device comprising:
a display panel having a display area on a first surface of a substrate;
a touch sensor next to the first surface of the display panel, the touch sensor overlapping with the display panel;
a first pressure sensor next to a second surface opposite to the first surface of the display panel, the first pressure sensor overlapping with the display panel;
a second pressure sensor, the second pressure sensor not overlapping with the first pressure sensor;
a digitizer for receiving an output from the first pressure sensor and outputting a signal according to a value of the output;
a trigger generating circuit for receiving the output from the second pressure sensor and generating a trigger signal;
a control circuit for driving the display panel, the touch sensor, and the first pressure sensor; and
a power supply circuit for supplying first electric power to the display panel, the touch sensor, the second pressure sensor, the digitizer, and the control circuit,
wherein the trigger generating circuit is configured to receive second electric power supplied from the second pressure sensor in response to an input to the second pressure sensor while the power supply circuit does not supply the first electric power, generate the trigger signal based on the second electric power supplied from the second pressure sensor, and input the trigger signal to the power supply circuit to make the power supply circuit capable of supplying the first electric power.

8. The display device according to claim 7, wherein the trigger generating circuit is adapted to receive the second electric power only through the output from the second pressure sensor.

9. The display device according to claim 7, wherein the display panel is an organic EL display panel having an organic EL element in the display area, the organic EL element comprising
some pixel electrodes on the substrate,
an organic layer containing a light emission layer on the pixel electrodes, and
a counter electrode on the organic layer,
wherein the touch sensor includes a plurality of touch electrodes on a surface of an insulating layer on the organic EL element.

10. The display device according to claim 7, wherein the display panel is a liquid crystal display panel having a liquid crystal element in the display area, the display device further comprising an optical unit between the liquid crystal display panel and the first pressure sensor.

11. The display device according to claim 7, wherein the substrate has flexibility.

12. A personal digital assistant comprising a casing, the casing containing the display device according to claim 7.

* * * * *